United States Patent
Zhao et al.

(10) Patent No.: US 9,766,741 B2
(45) Date of Patent: Sep. 19, 2017

(54) SHIFT REGISTER, GATE INTEGRATED DRIVING CIRCUIT AND DISPLAY SCREEN

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Weijie Zhao, Beijing (CN); Xue Dong, Beijing (CN); Haisheng Wang, Beijing (CN); Shengji Yang, Beijing (CN); Yingming Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 102 days.

(21) Appl. No.: 14/443,589

(22) PCT Filed: Nov. 10, 2014

(86) PCT No.: PCT/CN2014/090747
§ 371 (c)(1),
(2) Date: May 18, 2015

(87) PCT Pub. No.: WO2015/180420
PCT Pub. Date: Dec. 3, 2015

(65) Prior Publication Data
US 2016/0266699 A1 Sep. 15, 2016

(30) Foreign Application Priority Data
May 30, 2014 (CN) .......................... 2014 1 0240531

(51) Int. Cl.
*G06F 3/041* (2006.01)
*G09G 3/36* (2006.01)
*G11C 19/28* (2006.01)

(52) U.S. Cl.
CPC .......... *G06F 3/0416* (2013.01); *G06F 3/0412* (2013.01); *G09G 3/3648* (2013.01);
(Continued)

(58) Field of Classification Search
CPC ....... G06F 3/0412; G09G 3/3674; G09G 5/18
See application file for complete search history.

(56) References Cited

U.S. PATENT DOCUMENTS

2003/0218594 A1 11/2003 Ishii
2013/0241814 A1* 9/2013 Hirabayashi ......... G09G 3/3677
345/100

(Continued)

FOREIGN PATENT DOCUMENTS

CN 101996684 A 3/2011
CN 202363089 U 8/2012

(Continued)

OTHER PUBLICATIONS
International Search Report Appln. No. PCT/CN2014/090747; Dated Mar. 11, 2015.
(Continued)

*Primary Examiner* — Gerald Johnson
(74) *Attorney, Agent, or Firm* — Ladas & Parry LLP (57) ABSTRACT

There is disclosed a shift register, a gate integrated driving circuit and a display screen. In the shift register, a connection point between the source of the first thin film transistor (T1) and the drain of the second thin film transistor (T2) is set as the first pulling-up node (PU1), a connection point between the capacitor (C1) and the gate of the third thin film transistor (T3) is set as the second pulling-up node (PU2), and the leakage-proof module is added between the first (Continued)

pulling-up node (PU1) and the second pulling-up node (PU2). The leakage-proof module is configured to, under the control of the display control signal terminal (CTI): conduct the path between the first pulling-up node (PU1) and the second pulling-up node (PU2) during the display period in a frame, so that the shift register can output a normal gate-on signal; and disconnect the path between the first pulling-up node (PU1) and the second pulling-up node (PU2) during the touch period in the frame, which is equivalent to connecting a resistor having a large resistance in a discharging path of the capacitor (C1) in series, so that the discharging of the capacitor (C1) can be slowed greatly, and a leakage speed of the capacitor (C1) is decreased effectively, which avoids a problem of abnormal displaying occurs possibly in an application of a touch screen with a high reporting rate.

18 Claims, 7 Drawing Sheets

(52) U.S. Cl.
CPC ......... *G09G 3/3677* (2013.01); *G11C 19/287* (2013.01); *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 2014/0159799 A1* | 6/2014 | Chen | G09G 3/3677 327/437 |
| 2014/0192039 A1 | 7/2014 | Wang | |
| 2015/0153862 A1* | 6/2015 | Nakamura | G06F 3/041 345/173 |

FOREIGN PATENT DOCUMENTS

| | | |
|---|---|---|
| CN | 102682727 A | 9/2012 |
| CN | 103236273 A | 8/2013 |
| CN | 103474038 A | 12/2013 |
| CN | 203503280 U | 3/2014 |
| CN | 104021769 A | 9/2014 |
| KR | 20120011765 A | 2/2012 |

OTHER PUBLICATIONS

Written Opinion of the International Searching Authority Appln. No. PCT/CN2014/090747; Dated Mar. 11, 2015.

* cited by examiner

SHIFT REGISTER, GATE INTEGRATED DRIVING CIRCUIT AND DISPLAY SCREEN

TECHNICAL FIELD

The present disclosure relates to a technique field of liquid crystal display, and particularly to a shift register, a gate integrated driving circuit and a display screen.

BACKGROUND

In a thin film transistor liquid crystal display (TFT-LCD), gate driving signals are generally provided to gates of respective Thin Film Transistors (TFTs) in an area of pixels by a gate driving apparatus. The gate driving apparatus can be formed on an array substrate of the liquid crystal display with an array process, namely, a gate driver on array (GOA) process. Such integration process not only saves the cost, but also can achieve an aesthetic design of two symmetrical sides of the liquid crystal panel, and at the same time, it can further remove a bonding area and a wiring space for fan-out in the gate integrated circuit (IC), so that a narrow bezel design can be realized. Also, such integration process can further remove a bonding process in a gate line direction, which can improve productivity and yield rate.

SUMMARY

Embodiments of the present disclosure provide a shift register, a gate integrated driving circuit and a display screen, which can address the issue of abnormal displaying occurs when the existing GOA circuit is applied to a touch panel with a high reporting rate.

According to an embodiment of the present disclosure, there is provided a shift register comprising:

a first thin film transistor having a gate connected with a signal input terminal, a drain connected with a first reference signal terminal, and a source connected with a first pulling-up node;

a second thin film transistor having a gate connected with a reset signal terminal, a drain connected with the first pulling-up node, and a source connected with a second reference signal terminal;

a third thin film transistor having a gate connected with the second pulling-up node, a drain connected with a clock signal terminal, and a source connected with a signal output terminal;

a fourth thin film transistor having a gate connected with a touch control signal terminal, a drain connected with the signal output terminal, a source connected with a low voltage signal terminal, wherein the touch control signal terminal is configured to turn on the fourth thin film transistor during a touch period and turn off the fourth thin film transistor during a display period;

a capacitor, provided between the second pulling-up node and the signal output terminal; and a leakage-proof module, provided among a display control signal terminal, the first pulling-up node and the second pulling-up node, and configured to, under a control of the display control signal terminal, conduct a path between the first pulling-up node and the second pulling-up node during the display period and disconnect the path between the first pulling-up node and the second pulling-up node during the touch period.

In the shift register according to an embodiment of the present disclosure, a connection point between the source of the first thin film transistor and the drain of the second thin film transistor is set as the first pulling-up node, a connection point between the capacitor and the gate of the third thin film transistor is set as the second pulling-up node, the leakage-proof module is added between the first pulling-up node and the second pulling-up node, and is configured to, under the control of the display control signal terminal: conduct the path between the first pulling-up node and the second pulling-up node during the display period in a frame, so that the shift register can output a normal gate-on signal; and disconnect the path between the first pulling-up node and the second pulling-up node during the touch period in the frame, which is equivalent to connecting a resistor having a large resistance in a discharging path of the capacitor in series, so that the discharging of the capacitor can be slowed greatly, and a leakage speed of the capacitor is decreased effectively, which avoids a problem of abnormal displaying occurs possibly in a case in which a period of frame in the touch screen is divided into a plurality of display periods and touch periods, which are alternative, to increase the reporting rate.

In a possible implementation, in the shift register according to an embodiment of the present disclosure, the leakage-proof module further comprises a fifth thin film transistor, having a gate connected with the display control signal terminal, a drain connected with the first pulling-up node and a source connected with the second pulling-up node.

In a possible implementation, in the shift register according to an embodiment of the present disclosure, all of the thin film transistors included in the shift register are N-type thin film transistors;

the display control signal terminal supplies a high level signal while the touch control signal terminal supplies a low level signal, during the display period; and the display control signal terminal supplies a low level signal while the touch control signal terminal supplies a high level signal, during the touch period.

In a possible implementation, in the shift register according to an embodiment of the present disclosure, when a forward scan is activated, the first reference signal terminal supplies a high level signal while the second reference signal terminal supplies a low level signal, during the display period; and the first reference signal terminal and the second reference signal terminal supply high level signals at the same time, during the touch period.

In a possible implementation, in the shift register according to an embodiment of the present disclosure, when a reverse scan is activated, the first reference signal terminal supplies a low level signal while the second reference signal terminal supplies a high level signal, during the display period; and the first reference signal terminal and the second reference signal terminal supply high level signals at the same time, during the touch period.

In a possible implementation, the shift register according to an embodiment of the present disclosure further comprises a pulling-down module, provided among the display control signal terminal, the first pulling-up node, the second pulling-up node, the signal output terminal and the low voltage signal terminal, configured to maintain the first pulling-up node, the second pulling-up node and the signal output terminal at a low level during a non-operational period of the shift register.

In a possible implementation, in the shift register according to an embodiment of the present disclosure, the pulling-down module comprises:

a sixth thin film transistor having a drain connected with the display control signal terminal, and a source connected with a pulling-down node;

a seventh thin film transistor having a drain connected with the pulling-down node, the gate connected with the second pulling-up node, and a source connected with the low voltage signal terminal;

an eighth thin film transistor having a gate and a drain thereof are connected with the display control signal terminal respectively, and a source connected with a gate of the sixth thin film transistor;

a ninth thin film transistor having a drain connected with the source of the eighth thin film transistor, a gate connected with the second pulling-up node, and a source connected with the low voltage signal terminal;

a tenth thin film transistor having a drain connected with the first pulling-up node, a gate connected with the pulling-down node, and a source connected with the low voltage signal terminal; and an eleventh thin film transistor having a drain connected with the signal output terminal, a gate connected with the pulling-down node; and a source connected with the low voltage signal terminal.

An embodiment of the present disclosure provides a gate integrated driving circuit comprising a plurality of stages of any one of shift registers according to the embodiments of the present disclosure connected in cascade;

except for the first stage of shift register and the last stage of shift register, each stage of shift registers outputs a trigger signal to a signal input terminal of a next stage of shift register adjacent thereto, and outputs a reset signal to a reset signal terminal of a previous stage of shift register adjacent thereto; the first stage of shift register outputs a trigger signal to the signal input terminal of the stage of second shift register; and the last shift register outputs a reset signal to its own reset signal terminal and the reset signal terminal of its previous stage of shift register.

An embodiment of the present disclosure provides a display screen comprising the gate integrated driving circuit according to the embodiments of the present disclosure.

DETAILED DESCRIPTION

Concrete implementations of the shift register, the gate integrated driving circuit and the display screen according to the embodiments of the present disclosure will be described in details in connection with accompanying drawings.

Figure 1A:
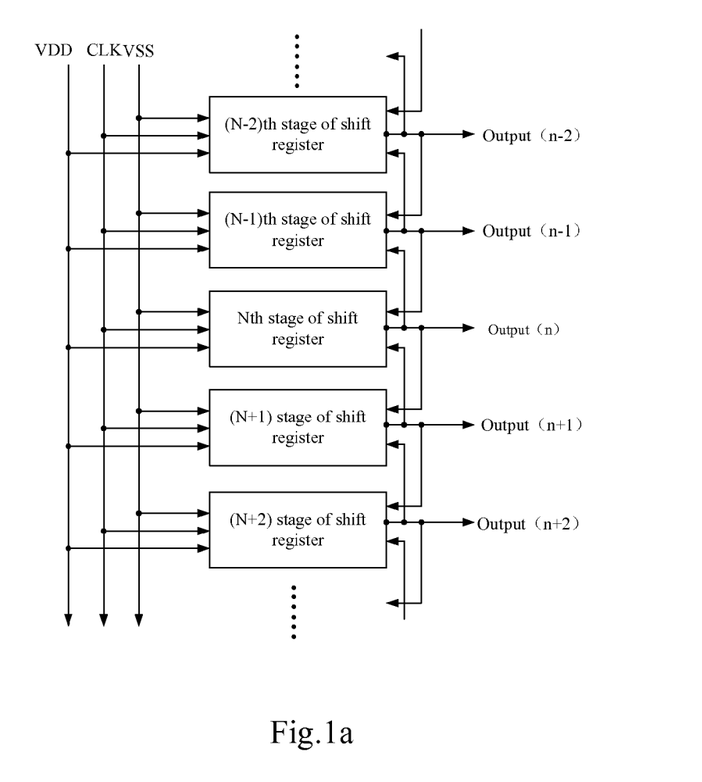
FIG. 1a is an exemplary diagram illustrating a structure of a GOA circuit.
Figure 1B:
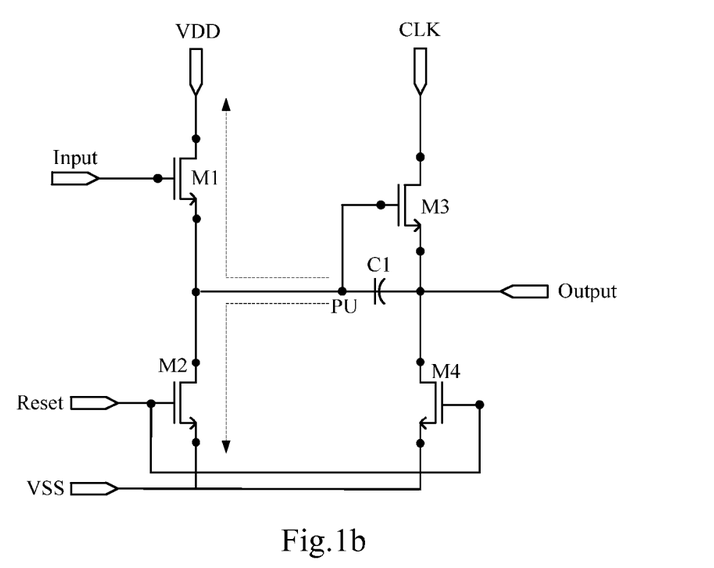
FIG. 1b is an exemplary diagram illustrating a structure of a shift register.

FIG. 1a illustrates a gate integrated driving circuit comprising a plurality of shift registers each configured to provide a gate scan signal to a corresponding gate connected with a signal output terminal of a respective shift register, to input a reset signal to a reset signal terminal of a corresponding previous shift register adjacent thereto, and to input a trigger signal to a signal input terminal of a corresponding next shift register adjacent thereto. FIG. 1b illustrates an exemplary diagram of a structure of a shift register, wherein a basic function of the shift register can be realized by using 4 thin film transistors M1-M4 and one capacitor C1, and its detailed operational principle is as follows. When a high level signal is input to the signal input terminal Input, the first thin film transistor M1 is turned on to charge a pulling-up node, namely a PU node, at this time the third thin film transistor M3 is turned on; when a high level signal is input to a clock signal terminal CLK, the third thin film transistor M3, which is turned on, makes the signal output terminal Output to output the high level signal supplied from the clock signal terminal CLK, and at the same time the PU node is further be pulled up due to a bootstrap effect of the capacitor C1; after that, when a high level signal is input to the reset signal terminal Reset, the second thin film transistor M2 and the fourth thin film transistor M4 are turned on so as to discharge the PU node and the signal output terminal Output respectively.

When an In-Cell touch screen is manufactured with an array substrate having the above GOA circuit, a period of one frame of a LCD screen can be divided into a plurality of display periods and touch periods in alternative, in order to increase a reporting rate of the touch to improve the touch effect. Thus, the GOA circuit operates only during the display periods, instead of outputting a gate-on signal to the gate signal line connected thereto sequentially as it used to, that is, the GOA circuit stops operation during the plurality of touch periods within the one period of frame. For example, the touch period is set between output timings of the (N−1)th stage of shift register and the Nth stage of shift register of GOA as illustrated in FIG. 1a, and after the (N−1)th stage of shift register operates, the trigger signal input to the signal input terminal of the Nth stage of shift register from the signal output terminal of the (N−1)th stage of shift register pulls up a potential at the PU node in the Nth stage of shift register, but the third thin film transistor M3 in the Nth stage of shift register would be turned on only after one touch period has elapsed, at this time, the PU node is in a floating state, the capacitor C1 starts to be discharged, whose is discharged via two paths (as denoted by dotted lines in FIG. 1b), one is from the node PU to a low voltage signal terminal VSS via the second thin film transistor M2, and the other is from the node PU to a high voltage signal terminal VDD via the first thin film transistor M1, such that an electric leakage phenomenon occurs at the PU node.

Especially the second thin film transistor M2 is manufactured in a non-display area of the display screen, its large size causes a large leakage current, which would quicken charges at the PU node to flow to the low voltage signal terminal VSS being at a low potential. After the touch period has elapsed, the third thin film transistor M3 in the Nth stage of shift register is turned on, but the voltage at the PU node has been dropped, which causes the gate-on signal on the gate signal line connected with the signal output terminal to be too low and results in a malfunction in display of the display screen.

Figure 2:
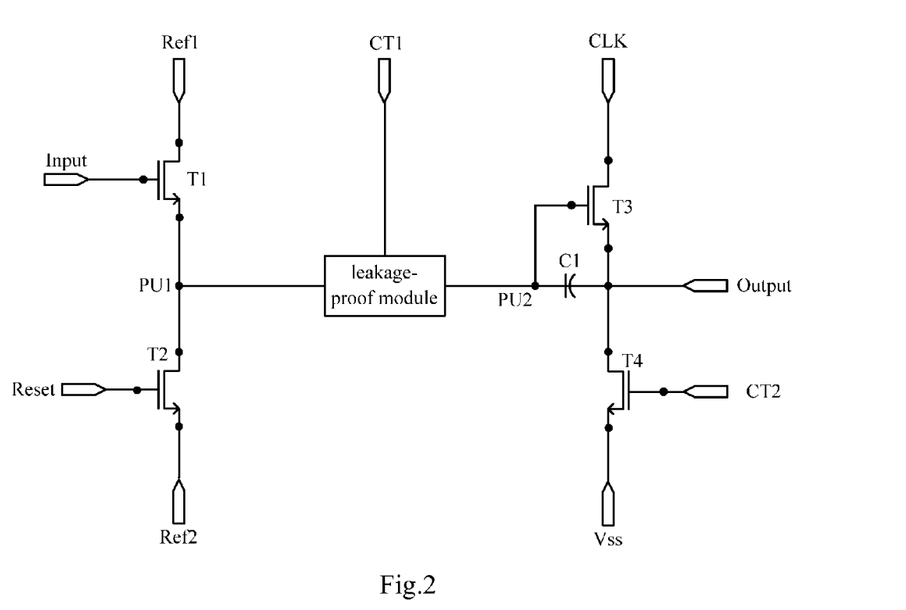
FIG. 2 is a first exemplary diagram illustrating a structure of a shift register according to an embodiment of the present disclosure.

As illustrated in FIG. 2, a shift register according to an embodiment of the present disclosure comprises:

a first thin film transistor T1 with a gate connected with a signal input terminal Input, a drain connected with a first reference signal terminal Ref1, and a source connected with a first pulling-up node PU1;

a second thin film transistor T2 with a gate connected with a reset signal terminal Reset, a drain connected with the first pulling-up node PU1, and a source connected with a second reference signal terminal Ref2;

a third thin film transistor T3 with a gate thereof connected with the second pulling-up node PU2, a drain connected with a clock signal terminal CLK, and a source connected with a signal output terminal Output;

a fourth thin film transistor T4 with a gate connected with a touch control signal terminal CT2, a drain connected with the signal output terminal Output, a source connected with a low voltage signal terminal VSS, wherein the touch control signal terminal CT2 is configured to turn on the fourth thin film transistor T4 during a touch period and turn off the fourth thin film transistor T4 during a display period;

a capacitor C1, provided between the second pulling-up node PU2 and the signal output terminal Output; and a leakage-proof module, provided among a display control signal terminal CT1, the first pulling-up node PU1 and the second pulling-up node PU2, and configured to conduct a path between the first pulling-up node PU1 and the second pulling-up node PU2 during the display period and disconnect the path between the first pulling-up node PU1 and the second pulling-up node PU2 during the touch period under a control of the display control signal terminal CT1.

In the shift register according to an embodiment of the present disclosure, a connection point between the source of the first thin film transistor T1 and the drain of the second thin film transistor T2 is set as the first pulling-up node PU1, a connection point between the capacitor C1 and the gate of the third thin film transistor T3 is set as the second pulling-up node PU2, the leakage-proof module is added between the first pulling-up node PU1 and the second pulling-up node PU2, and this leakage-proof module is configured to, under the control of the display control signal terminal CT1, conduct a path between the first pulling-up node PU1 and the second pulling-up node PU2 during the display period in a frame, so that the shift register can output a normal gate-on signal; and disconnect the path between the first pulling-up node PU1 and the second pulling-up node PU2 during the touch period in the frame, which is equivalent to connecting a resistor having a large resistance in the discharging path of the capacitor C1 in series, so that the discharging of the capacitor C1 can be slowed greatly, and a leakage speed of the capacitor C1 is decreased effectively, which avoids a problem of abnormal displaying occurs possibly in a case in which a period of frame of the touch screen is divided into a plurality of display periods and touch periods, which are alternative, to increase the reporting rate.

It should be noted that, in the shift register according to the embodiment of the present disclosure, functions of the source and drain of the thin film transistor can be exchanged depending on the different type of the transistor and the different input signals, and details are omitted herein.

Figure 3:
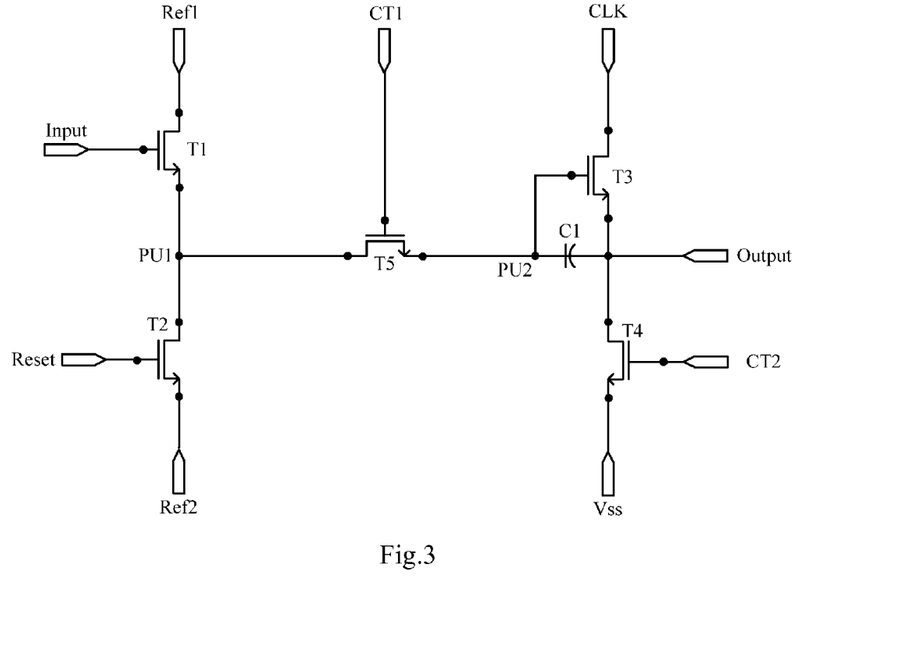
FIG. 3 is a second exemplary diagram illustrating a structure of the shift register according to an embodiment of the present disclosure.

Optionally, to facilitate the implementation, in the shift register according to an embodiment of the present disclosure, as illustrated in FIG. 3, the leakage-proof module can particularly comprise a fifth thin film transistor with a gate connected with the display control signal terminal CT1, a drain connected with the first pulling-up node PU1 and a source connected with the second pulling-up node PU2.

In particular, in the shift register according to an embodiment of the present disclosure, the same type of thin film transistor is adopted as the fifth thin film transistor T5, as the leakage-proof module, and as all of other thin film transistors included in the shift register, and in an actual implementation, N-type thin film transistors are adopted in general.

In a specific implementation, in order to ensure that the signal output terminal of the shift register described above according to the embodiment of the present disclosure can output the gate-on signal normally during the respective display periods within one frame, the display control signal terminal CT1 would supply a stable high level signal all the time during the display period, so that the fifth thin film transistor T5 is in a turned-on state, that is, the path between the first pulling-up node PU1 and the second pulling-up node PU2 is in a conductive state; correspondingly, the touch control signal terminal CT2 supplies a stable low level signal all the time so as to ensure the fourth thin film transistor T4 to be in a turned-off state. During the touch period, the display control signal terminal supplies a stable low level signal all the time, so that the fifth thin film transistor T5 is in a turned-off state, that is, the path between the first pulling-up node PU1 and the second pulling-up node PU2 are in a nonconductive state; correspondingly, the touch control signal terminal CT2 supplies a stable high level signal all the time so as to ensure the fourth thin film transistor T4 to be in a turned-on state so as to pull down the voltage at the signal output terminal Output, which can guarantee that no signal is output.

Further, since the signal input terminal and the reset signal terminal are designed symmetrically in the above-described shift register according to the embodiment of the present disclosure and their functions can be exchanged, the shift register according to the embodiment of the present disclosure can realize a bi-direction scan.

Figure 4A:
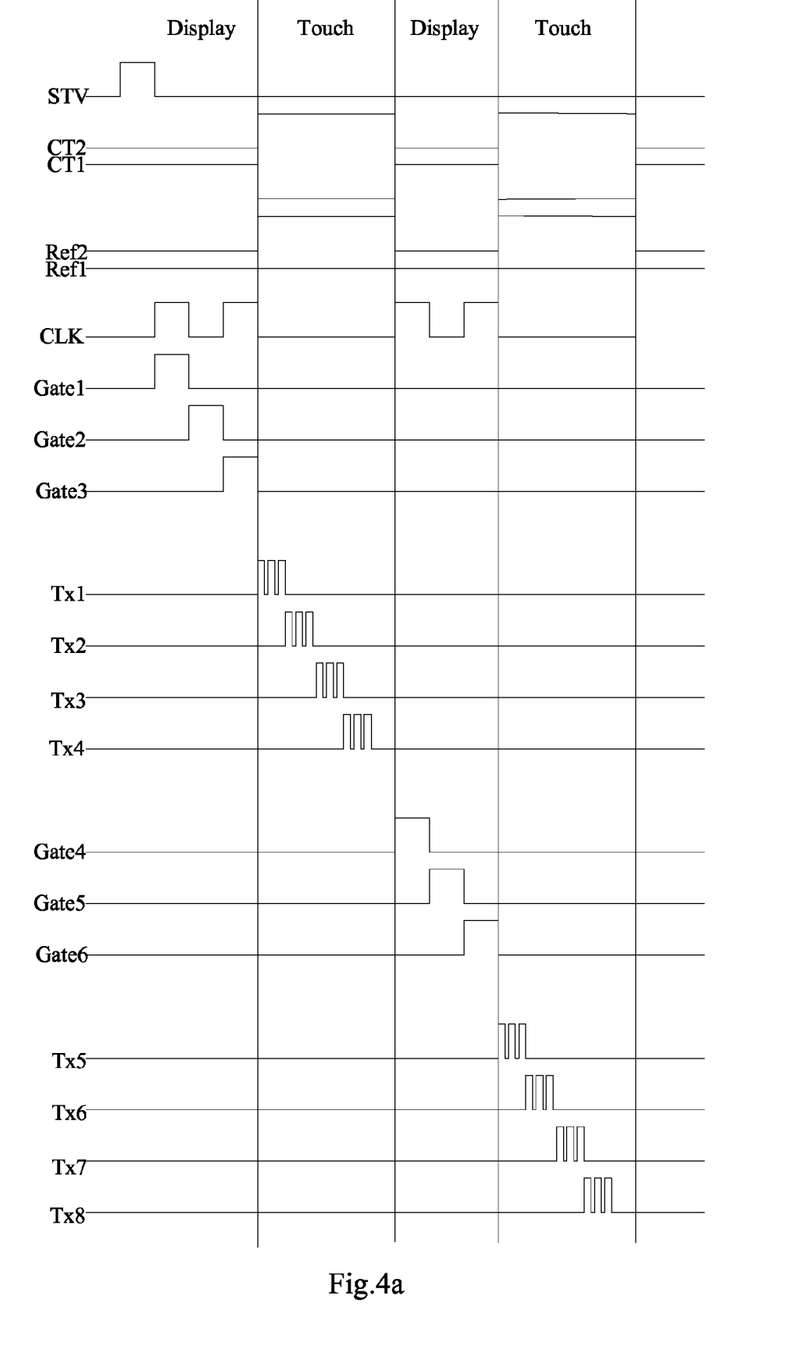
FIGS. 4a and 4b are timing diagrams illustrating a forward scanning and a reverse scanning of the shift register according to embodiments of the present disclosure, respectively.

Generally, when a forward scan is activated, as illustrated in FIG. 4a, the first reference signal terminal Ref1 supplies a high level signal while the second reference signal terminal Ref2 supplies a low level signal, during the display period (Display). Optionally, in order to further slow the leakage speed of the capacitor C1, the second reference signal terminal Ref2 can be set at a high level during the touch period (Touch), that is, the second reference signal terminal Ref2 and the first reference signal terminal Ref1 supply high level signals at the same time, which can further slow the flowing of the current.

Figure 4B:
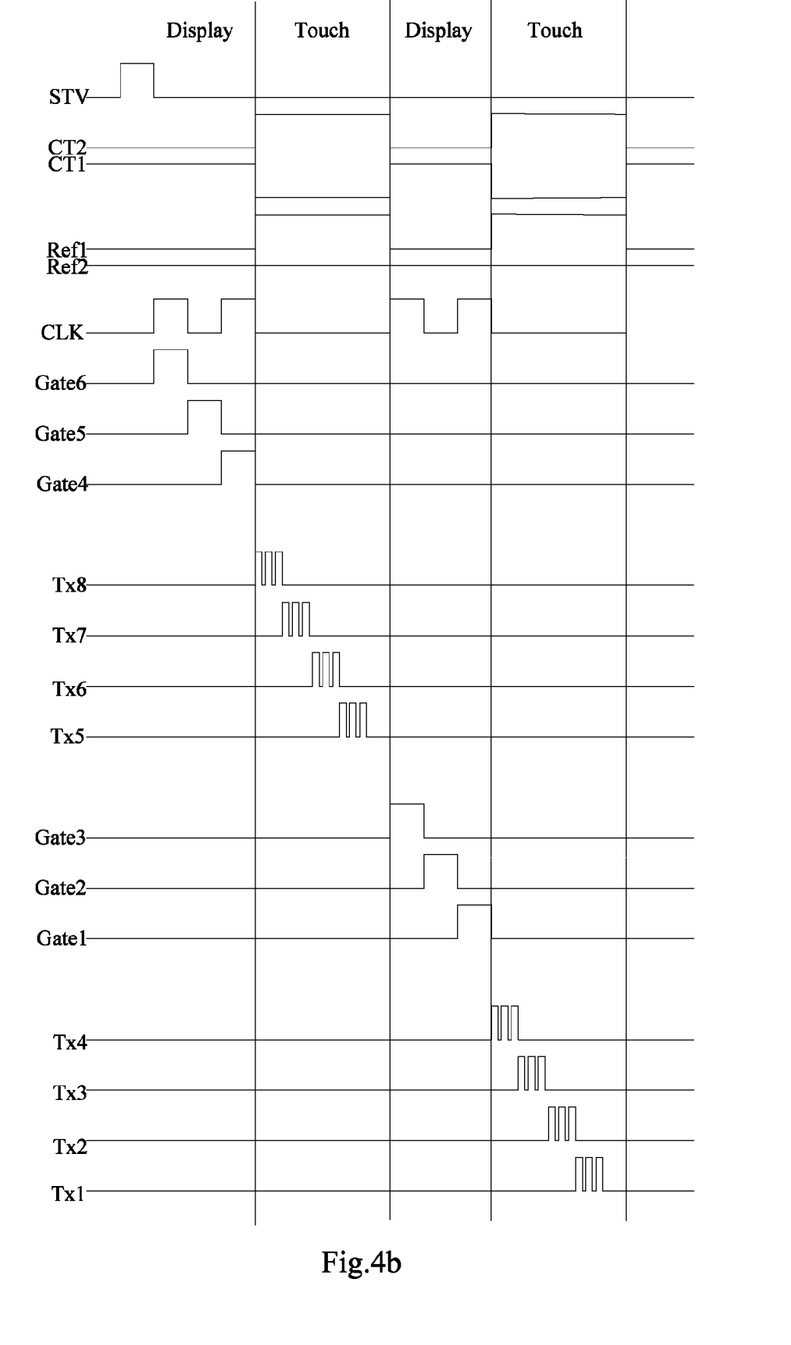

Generally, when a reverse scan is activated, as illustrated in FIG. 4b, the first reference signal terminal Ref1 supplies a low level signal while the second reference signal terminal Ref2 supplies a high level signal, during the display period (Display). Optionally, in order to further slow the leakage speed of the capacitor C1, the first reference signal terminal Ref1 can be set at a high level during the touch period (Touch), that is, the first reference signal terminal Ref1 and the second reference signal terminal Ref2 supply high level signals at the same time, which can further slow the flowing of the current.

Figure 4C:
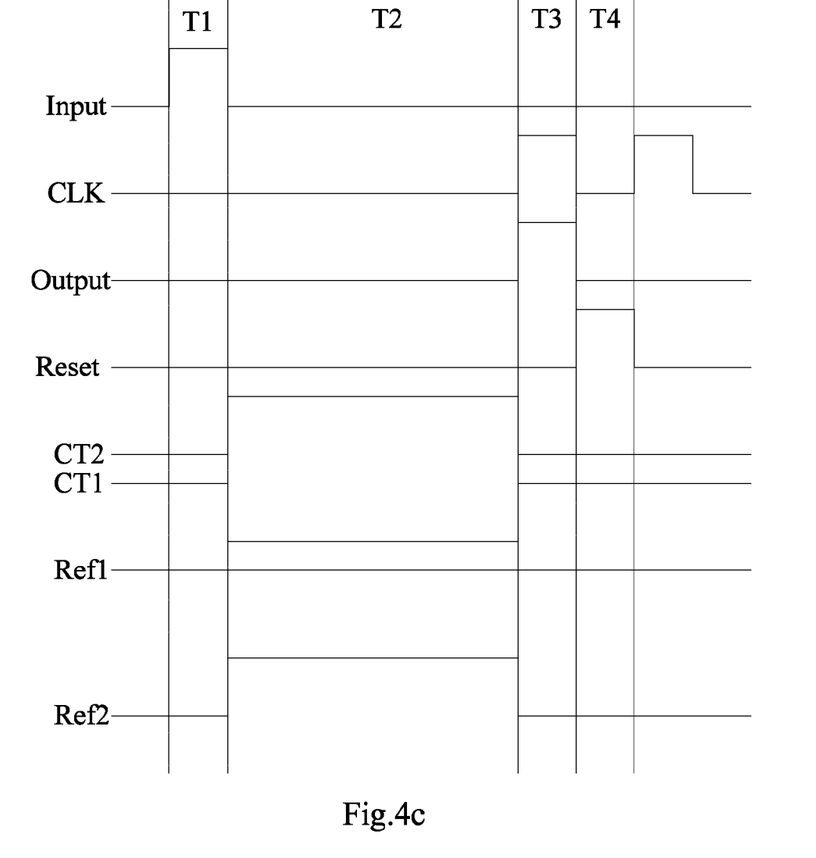
FIG. 4c is a timing diagram illustrating inputs and outputs of a shift register according to an embodiment of the present disclosure in detail.

Thereafter, the operating process of the shift register according to the embodiment of the present disclosure would be described by taking the forward scan as an example, with reference to the shift register illustrated in FIG. 3 and the input-output timing for the shift register illustrated in FIG. 4c. In particular, four phases T1-T4 are selected, as illustrated in the input-output timing diagram of FIG. 4c. In the following description, 1 denotes a high level signal while 0 denotes a low level signal.

In the T1 phase, Input=1, CLK=0, Reset=0, Ref1=1, Ref2=0, CT1=1, and CT2=0. since CT1=1, the fifth thin film transistor T5 is turned on, the path between the first pulling-up node PU1 and the second pulling-up node PU2 is conducted; since Input=1, the first thin film transistor T1 is turned on and the shift register is controlled to start to operate, the first reference signal terminal Ref1 pulls up the second pulling-up node PU2 through the first thin film transistor T1 and charges the capacitor C1. When the second pulling-up node PU2 is at a high level, the third thin film transistor T3 is turned on, but the signal output terminal Output outputs a low level signal since the CLK=0. The T1 phase is a charging phase for the capacitor C1 in the shift register.

In the T2 phase, Input=0, CLK=0, Reset=0, Ref1=1, Ref2=1, CT1=0, and CT2=1. At this time, the first thin film transistor T1, the second thin film transistor T2 and the fifth thin film transistor T5 are turned off, the second pulling-up node PU2 remains at the high level, and when the second pulling-up node PU2 is at the high level, the third thin film transistor T3 is turned on; however, the signal output terminal Output outputs the low level signal since the CLK=0. And, since CT2=1, the fourth thin film transistor T4 is in the turned-on state, which can pull down the noise from the signal output terminal Output in time. The T2 phase is the touch period.

In the T3 phase, Input=0, CLK=1, Reset=0, Ref1=1, Ref2=0, CT1=1, and CT2=0. Since Input=0, the first thin film transistor T1 is turned off; the third thin film transistor T3 remains on, and outputs the high level at the clock signal terminal CLK to the signal output terminal Output since CLK=1, and the second pulling-up node PU2 is further pulled up due to a bootstrap effect of the capacitor C1; the high level at the CLK is output from the signal output terminal Output to a gate line corresponding to the shift register, so that all of thin film transistors located on this gate line within a display area of the liquid crystal panel are turned on and a data signal line starts to write a signal. The T3 phase is a phase during which the shift register is switched on.

In the T4 phase, Input=0, CLK=0, Reset=1, Ref1=1, Ref2=0, CT1=1, and CT2=0. Since Reset=1, the second thin film transistor T2 is turned on. In theory, the second pulling-up node PU2 is pulled down to the low level at the second reference signal terminal Ref2 after the second thin film transistor T2 is turned on. Further, the third thin film transistor T3 enters into the turned-off state from the turned-on state and the signal output terminal Output outputs the low level signal, when the second pulling-up node PU2 changes to be at a low level from a high level. The T4 phase is a discharging phase for the capacitor C1 in the shift register.

Figure 5:
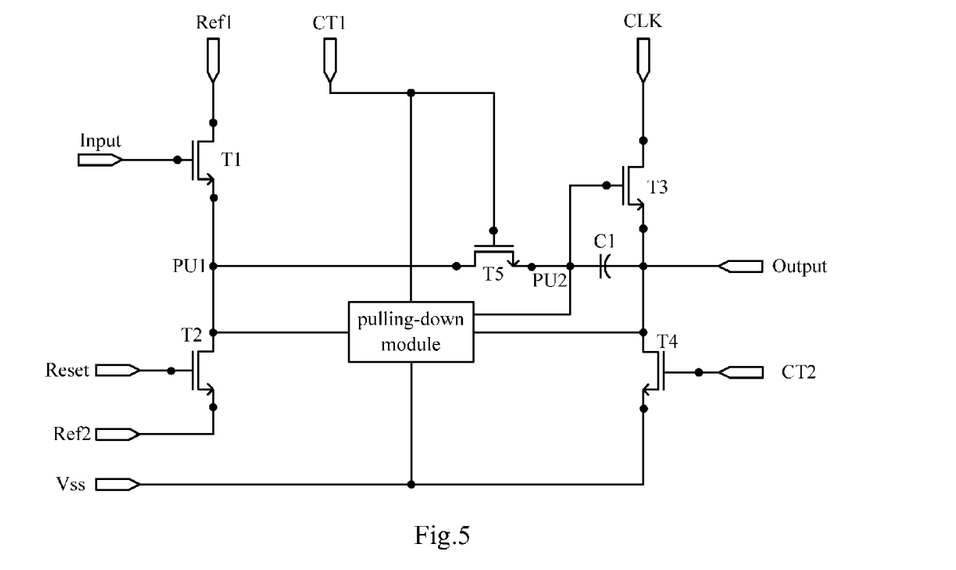
FIG. 5 is a first exemplary diagram illustrating a structure of the shift register having a pulling-down module according to an embodiment of the present disclosure.

In actual operations, in the T4 phase, the voltage at the second pulling-up node PU2 is changed to the low level from the high level gradually and the third thin film transistor T3 is also changed to a turned-off state from the turned-on state gradually; during this procedure, it cannot be guaranteed that no noise is output from the signal output terminal Output (the noise at the signal output terminal Output would be generated as a generation of the noise at the second pulling-up node PU2). Therefore, in order to reduce the noises from the second pulling-up node PU2 and the signal output terminal Output, as illustrated in FIG. 5, the shift register according to the embodiment of the present disclosure further comprises a pulling-down module, provided among the display control signal terminal CT1, the first pulling-up node PU1, the second pulling-up node PU2, the signal output terminal Output and the low voltage signal terminal VSS, configured to maintain the first pulling-up node PU1, the second pulling-up node PU2 and the signal output terminal Output to be at a low level during a non-operation period of the shift register, so that the output of the noise is decreased.

Figure 6:
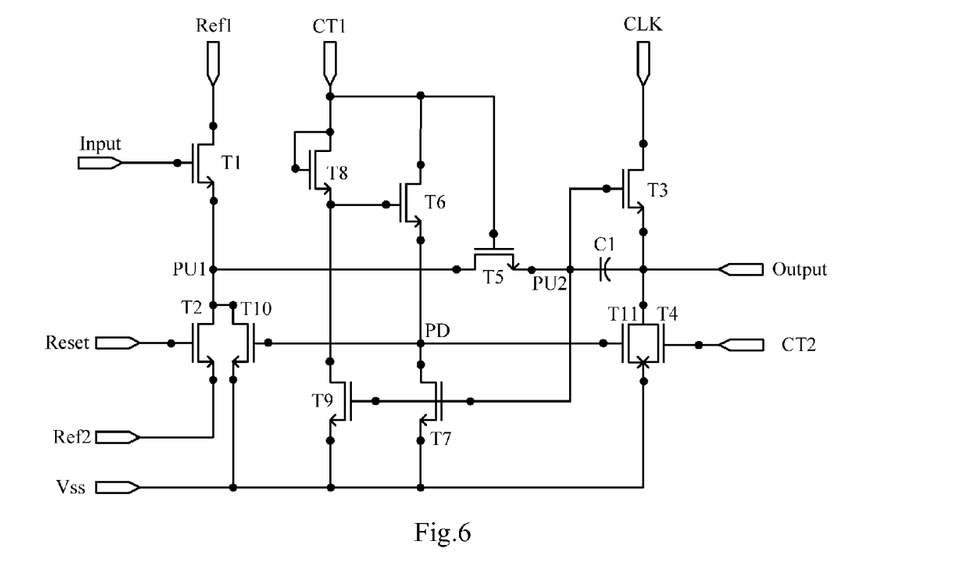
FIG. 6 is a second exemplary diagram illustrating a structure of the shift register having the pulling-down module according to an embodiment of the present disclosure.

In a specific implementation, as illustrated in FIG. 6, the pulling-down module in the shift register according to an embodiment of the present disclosure can comprises:

a sixth thin film transistor T6 with a drain connected with the display control signal terminal CT1, and a source connected with a pulling-down node PD;

a seventh thin film transistor T7 with a drain connected with the pulling-down node PD, the gate connected with the second pulling-up node PU2, and a source connected with the low voltage signal terminal VSS;

an eighth thin film transistor T8 with a gate and a drain connected with the display control signal terminal CT1 respectively, and a source connected with a gate of the sixth thin film transistor T6;

a ninth thin film transistor T9 with a drain connected with the source of the eighth thin film transistor T8, a gate connected with the second pulling-up node PU2, and a source connected with the low voltage signal terminal VSS;

a tenth thin film transistor T10 with a drain connected with the first pulling-up node PU1, a gate connected with the pulling-down node PD, and a source connected with the low voltage signal terminal VSS; and an eleventh thin film transistor T11 with a drain connected with the signal output terminal Output, a gate connected with the pulling-down node PD, and a source connected with the low voltage signal terminal VSS.

Thereafter, the operating process of the pulling-down module in the shift register according to an embodiment of the present disclosure would be described by taking the forward scan as an example, with reference to the shift register illustrated in FIG. 6 and the input-output timing illustrated in FIG. 4c.

In the T1 and T2 phases, since CT1=10, the eighth thin film transistor T8 is turned on so as to turn on the sixth thin film transistor T6, the voltage at the pulling-down node PD is pulled up, therefore the tenth thin film transistor T10 and the eleventh thin film transistor T11 are in the turned-on state, so that the noises from the first pulling-up node PU1 and the second pulling-up node PU2 together with the noise from the signal output terminal Output are delivered to the low voltage signal terminal VSS.

In the T3 phase, the second pulling-up node PU2 is further pulled up due to the bootstrap effect of the capacitor C1; therefore the seventh thin film transistor T7 and the ninth thin film transistor T9 are in the turned-on state, and the voltage at the pulling-down node PD is pulled down, so that the tenth thin film transistor T10 and the eleventh thin film transistor T11 are in the turned-off state, which ensures the normal output of the signal output terminal Output.

In the T4 phase, since the second pulling-up node PU2 is pulled down after the second thin film transistor T2 is turned on, the seventh thin film transistor T7 and the ninth thin film transistor T9 are in the turned-off state, the CT1 is at high, the T8, T6 are turned on, the voltage at the pulling-down node PD is pulled up gradually, and therefore the tenth thin film transistor T10 and the eleventh thin film transistor T11 are in the turned-on state, so that the noises from the first pulling-up node PU1 and the second pulling-up node PU2 together with the noise from the signal output terminal Output are delivered to the second reference signal terminal Ref 2 or the low voltage signal terminal VSS.

Above descriptions are only illustrative to explain the specific structure of the pulling-down module in the shift register, but the actual structure of the pulling-down module is not limited to the structure described in the embodiments of the present disclosure as actually implemented, which can also be other structure known to those skilled in the art, and there is no limitations herein.

Figure 7:
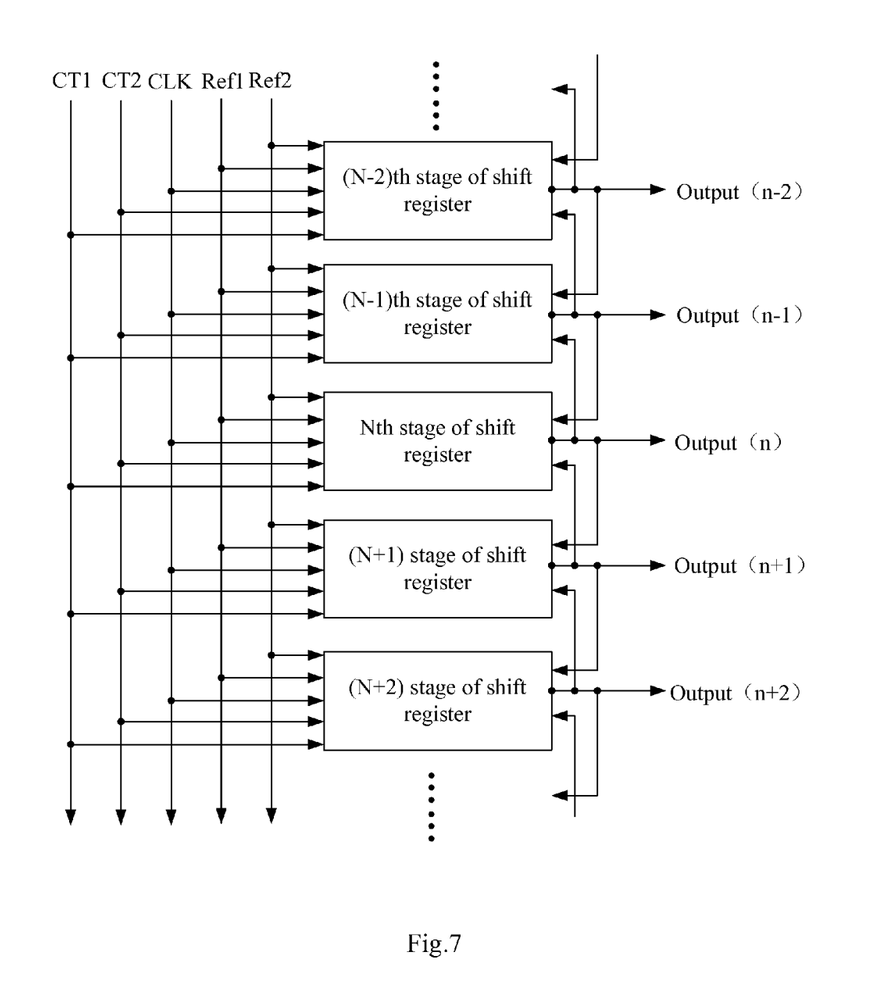
FIG. 7 is an exemplary diagram illustrating a structure of a gate integrated driving circuit according to an embodiment of the present disclosure.

Based on the same inventive conception, an embodiment of the present disclosure further provides a gate integrated driving circuit, as illustrated in FIG. 7, comprising a plurality of stages of shift registers connected in cascade; except for the first stage of shift register and the last stage of shift register, the signal output terminal Output of each stage of shift register outputs a trigger signal to the signal input terminal of the next stage of shift register adjacent thereto, and outputs a reset signal to the reset signal terminal of the previous stage of shift register adjacent thereto; the signal output terminal Output of the first stage of shift register outputs a trigger signal to the signal input terminal of the second stage of shift register; and the signal output terminal Output of the last stage of shift register outputs a reset signal to its own reset signal terminal and the reset signal terminal of its previous stage of shift register.

For a purpose of facilitating illustration, only five stage of shift registers are illustrated in FIG. 7, denoted as the (N−2)th stage of shift register, the (N−1)th stage of shift register, the Nth stage of shift register, the (N+1)th stage of shift register and the (N+2)th stage of shift register. Herein, the signal output terminal Output(n) of the Nth stage of shift register not only outputs a gate-on signal to the gate signal line connected therewith, but also outputs a reset signal to the (N−1)th stage of shift register, and outputs a trigger signal to the (N+1)th stage of shift register at the same time.

Particularly, the detailed function and structure of each stage of shift register in the gate integrated driving circuit described above are as same as those of the shift register according to the embodiments of the present disclosure, which have been described previously, therefore it is not repeated herein.

Based on the same inventive conception, an embodiment of the present disclosure further provides a display screen comprising the above gate integrated driving circuit, and its detailed implementations can refer to the description for the gate integrated driving circuit described previously, so it is not repeated herein.

In the shift register, the gate integrated driving circuit and the display screen according to the embodiments of the present disclosure, a connection point between the source of the first thin film transistor and the drain of the second thin film transistor is set as the first pulling-up node, a connection point between the capacitor and the gate of the third thin film transistor is set as the second pulling-up node, the leakage-proof module is incorporated between the first pulling-up node and the second pulling-up node, and this leakage-proof module is configured to, under the control of the display control signal terminal: conduct the path between the first pulling-up node and the second pulling-up node during the display period in a frame, so that the shift register can output a normal gate-on signal; and disconnect the path between the first pulling-up node and the second pulling-up node during the touch period in the frame, which is equivalent to connecting a resistor having a large resistance in a discharging path of the capacitor in series, so that the discharging of the capacitor can be slowed greatly, a leakage speed of the capacitor is decreased effectively, which avoids a problem of abnormal displaying occurs possibly in a case in which a period of frame for the touch screen is divided into a plurality of display periods and touch periods, which are alternative, to increase the reporting rate.

Obviously, those skilled in the art can make various changes and variations on the present disclosure without departing from the spirit and scope of the present disclosure. Thus, the present disclosure intends to cover the changes and variations to the present disclosure if such changes and variations belong to the scope defined by the claims of the present disclosure and equivalence thereof.

This application claims the priority of the Chinese Patent Application No. 201410240531.8, filed on May 30, 2014, with the China's State Intellectual Property Office, the disclosure of which is incorporated by reference herein as a whole.

What is claimed is:

1. A shift register, comprising:
   a first thin film transistor having a gate connected with a signal input terminal, a drain connected with a first reference signal terminal, and a source connected with a first pulling-up node;
   a second thin film transistor having a gate connected with a reset signal terminal, a drain connected with the first pulling-up node, and a source connected with a second reference signal terminal;
   a third thin film transistor having a gate connected with the second pulling-up node, a drain connected with a clock signal terminal, and a source connected with a signal output terminal;
   a fourth thin film transistor having a gate connected with a touch control signal terminal, a drain connected with the signal output terminal, a source connected with a low voltage signal terminal, wherein the touch control signal terminal is configured to turn on the fourth thin film transistor during a touch period and turn off the fourth thin film transistor during a display period;
   a capacitor, provided between the second pulling-up node and the signal output terminal; and
   a leakage-proof module, provided among a display control signal terminal, the first pulling-up node and the second pulling-up node, wherein the leakage-proof module is configured to, under a control of the display control signal terminal, conduct a path between the first pulling-up node and the second pulling-up node during the display period and disconnect the path between the first pulling-up node and the second pulling-up node during the touch period.

2. The shift register of claim wherein the leakage-proof module comprises a fifth thin film transistor having a gate connected with the display control signal terminal, a drain connected with the first pulling-up node and a source connected with the second pulling-up node.

3. The shift register of claim 1, wherein all of the thin film transistors included in the shift register are N-type thin film transistors;

the display control signal terminal supplies a high level
   signal while the touch control signal terminal supplies
   a low level signal, during the display period; and
the display control signal terminal supplies a low level
   signal while the touch control signal terminal supplies
   a high level signal, during the touch period.
4. The shift register of claim 3, wherein in a case in which a forward scan is activated, the first reference signal terminal supplies a high level signal while the second reference signal terminal supplies a low level signal, during the display period; and
   the first reference signal terminal and the second reference signal terminal supply high level signals at the same time, during the touch period.
5. The shift register of claim 3, wherein in a case in which a reverse scan is activated, the first reference signal terminal supplies a low level signal while the second reference signal terminal supplies a high level signal, during the display period; and
   the first reference signal terminal and the second reference signal terminal supply high level signals at the same time during the touch period.
6. The shift register of claim 1, further comprising a pulling-down module, provided among the display control signal terminal, the first pulling-up node, the second pulling-up node, the signal output terminal and the low voltage signal terminal, configured to maintain the first pulling-up node, the second pulling-up node and the signal output terminal at a low level during a non-operational period of the shift register.
7. The shift register of claim 6, wherein the pulling-down module comprises:
   a sixth thin film transistor having a drain connected with the display control signal terminal, and a source connected with a pulling-down node;
   a seventh thin film transistor having a drain connected with the pulling-down node, the gate connected with the second pulling-up node, and a source connected with the low voltage signal terminal;
   an eighth thin film transistor having a gate and a drain connected with the display control signal terminal, and a source connected with a gate of the sixth thin film transistor;
   a ninth thin film transistor having a drain connected with the source of the eighth thin film transistor, a gate connected with the second pulling-up node, and a source connected with the low voltage signal terminal;
   a tenth thin film transistor having a drain connected with the first pulling-up node, a gate connected with the pulling-down node, and a source connected with the low voltage signal terminal; and
   an eleventh thin film transistor having a drain connected with the signal output terminal, a gate connected with the pulling-down node; and a source connected with the low voltage signal terminal.
8. A gate integrated driving circuit comprising a plurality of stages of the shift register of claim 1 connected in cascade; wherein
   except for a first stage of shift register and a last stage of shift register, each stage of shift register is configured to output a trigger signal to a signal input terminal of a next stage of shift register adjacent thereto, and to output a reset signal to a reset signal terminal of a previous stage of shift register adjacent thereto; the first stage of shift register is configured to output a trigger signal to the signal input terminal of a second stage of shift register; and the last stage of shift register is configured to output the reset signal to its own reset signal terminal and the reset signal terminal of its previous stage of shift register.
9. A display screen comprising the gate integrated driving circuit of claim 8.
10. The gate integrated driving circuit of claim 8, wherein the leakage-proof module comprises a fifth thin film transistor having a gate connected with the display control signal terminal, a drain connected with the first pulling-up node and a source connected with the second pulling-up node.
11. The gate integrated driving circuit of claim 8, wherein all of the thin film transistors included in the shift register are N-type thin film transistors;
   the display control signal terminal supplies a high level signal while the touch control signal terminal supplies a low level signal, during the display period; and
   the display control signal terminal supplies a low level signal while the touch control signal terminal supplies a high level signal, during the touch period.
12. The gate integrated driving circuit of claim 11, wherein in a case in which a forward scan is activated, the first reference signal terminal supplies a high level signal while the second reference signal terminal supplies a low level signal, during the display period; and
   the first reference signal terminal and the second reference signal terminal supply high level signals at the same time, during the touch period.
13. The gate integrated driving circuit of claim 11, wherein in a case in which a reverse scan is activated, the first reference signal terminal supplies a low level signal while the second reference signal terminal supplies a high level signal, during the display period; and
   the first reference signal terminal and the second reference signal terminal supply high level signals at the same time during the touch period.
14. The gate integrated driving circuit of claim 8, wherein each stage of shift register further comprises a pulling-down module, provided among the display control signal terminal, the first pulling-up node, the second pulling-up node, the signal output terminal and the low voltage signal terminal, configured to maintain the first pulling-up node, the second pulling-up node and the signal output terminal at a low level during a non-operational period of the stage of shift register.
15. The gate integrated driving circuit of claim 14, wherein the pulling-down module comprises:
   a sixth thin film transistor having a drain connected with the display control signal terminal, and a source connected with a pulling-down node;
   a seventh thin film transistor having a drain connected with the pulling-down node, the gate connected with the second pulling-up node, and a source connected with the low voltage signal terminal;
   an eighth thin film transistor having a gate and a drain connected with the display control signal terminal, and a source connected with a gate of the sixth thin film transistor;
   a ninth thin film transistor having a drain connected with the source of the eighth thin film transistor, a gate connected with the second pulling-up node, and a source connected with the low voltage signal terminal;
   a tenth thin film transistor having a drain connected with the first pulling-up node, a gate connected with the pulling-down node, and a source connected with the low voltage signal terminal; and
   an eleventh thin film transistor having a drain connected with the signal output terminal, a gate connected with the pulling-down node; and a source connected with the low voltage signal terminal.

16. The display screen of claim 9, wherein the leakage-proof module comprises a fifth thin film transistor having a gate connected with the display control signal terminal, a drain connected with the first pulling-up node and a source connected with the second pulling-up node.

17. The display screen of claim 9, wherein each stage of shift register further comprises a pulling-down module, provided among the display control signal terminal, the first pulling-up node, the second pulling-up node, the signal output terminal and the low voltage signal terminal, configured to maintain the first pulling-up node, the second pulling-up node and the signal output terminal at a low level during a non-operational period of the stage of shift register.

18. The display screen of claim 17, wherein the pulling-down module comprises:
- a sixth thin film transistor having a drain connected with the display control signal terminal, and a source connected with a pulling-down node;
- a seventh thin film transistor having a drain connected with the pulling-down node, the gate connected with the second pulling-up node, and a source connected with the low voltage signal terminal;
- an eighth thin film transistor having a gate and a drain connected with the display control signal terminal, and a source connected with a gate of the sixth thin film transistor;
- a ninth thin film transistor having a drain connected with the source of the eighth thin film transistor, a gate connected with the second pulling-up node, and a source connected with the low voltage signal terminal;
- a tenth thin film transistor having a drain connected with the first pulling-up node, a gate connected with the pulling-down node, and a source connected with the low voltage signal terminal; and
- an eleventh thin film transistor having a drain connected with the signal output terminal, a gate connected with the pulling-down node; and a source connected with the low voltage signal terminal.

\* \* \* \* \*